United States Patent
Bae et al.

(10) Patent No.: US 7,961,121 B2
(45) Date of Patent: *Jun. 14, 2011

(54) TRANSMITTING/RECEIVING METHODS AND SYSTEMS WITH SIMULTANEOUS SWITCHING NOISE REDUCING PREAMBLES

(75) Inventors: Seung-Jun Bae, Daejeon (KR); Seong-Jin Jang, Seongnam-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/824,156

(22) Filed: Jun. 26, 2010

(65) Prior Publication Data

US 2010/0259426 A1 Oct. 14, 2010

Related U.S. Application Data

(63) Continuation of application No. 12/367,134, filed on Feb. 6, 2009, now Pat. No. 7,768,429, which is a continuation of application No. 11/693,264, filed on Mar. 29, 2007, now Pat. No. 7,492,288.

(30) Foreign Application Priority Data

Apr. 4, 2006 (KR) .................. 10-2006-0030752

(51) Int. Cl.
*H03M 5/00* (2006.01)
(52) U.S. Cl. ................. 341/58; 341/50; 341/51
(58) Field of Classification Search .......... 341/58, 341/50, 51; 365/219; 235/451
See application file for complete search history.

(56) References Cited

U.S. PATENT DOCUMENTS

| | | | |
|---|---|---|---|
| 4,486,739 A | 12/1984 | Franaszek et al. | |
| 4,736,370 A | 4/1988 | Hirome et al. | |
| 5,387,911 A | 2/1995 | Gleichert et al. | |
| 5,508,967 A * | 4/1996 | Karino | 365/219 |
| 5,533,034 A | 7/1996 | Kuwata et al. | |
| 6,026,124 A | 2/2000 | Lee | |
| 6,222,792 B1 | 4/2001 | Hanzawa et al. | |
| 6,421,291 B1 | 7/2002 | Watanabe et al. | |
| 6,633,951 B2 | 10/2003 | Cohen | |
| 6,779,724 B1 | 8/2004 | Yamada | |
| 7,170,818 B2 | 1/2007 | Kyung | |
| 7,457,192 B2 | 11/2008 | Kyung | |

FOREIGN PATENT DOCUMENTS

JP 09065464 3/1997

OTHER PUBLICATIONS

Office Action in German Patent Application 10 2007 016 461.2-31 dated Feb. 14, 2011.

* cited by examiner

*Primary Examiner* — Jean B Jeanglaude
(74) *Attorney, Agent, or Firm* — Muir Patent Consulting, PLLC

(57) ABSTRACT

DC balance encoded data is transmitted by transmitting a preamble of dummy data that is configured to provide an intermediate number of bits of a given logic value that is at least one bit of the given logic value but less than a maximum number of bits of the given logic value in the DC balance encoded data, to thereby reduce the simultaneous switching noise that is caused by transmission of a first word of DC balance encoded data. The preamble may contain one or more words of fixed and/or variable dummy data.

19 Claims, 13 Drawing Sheets

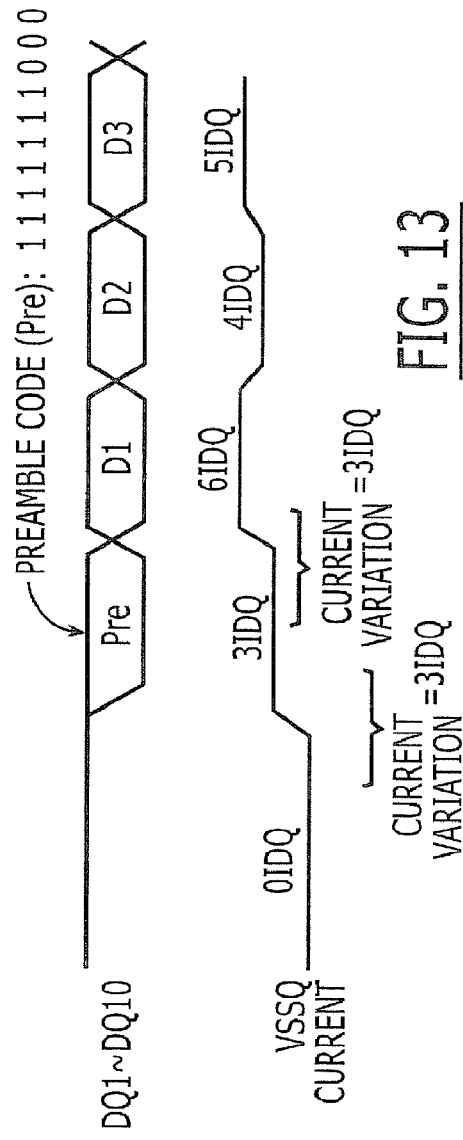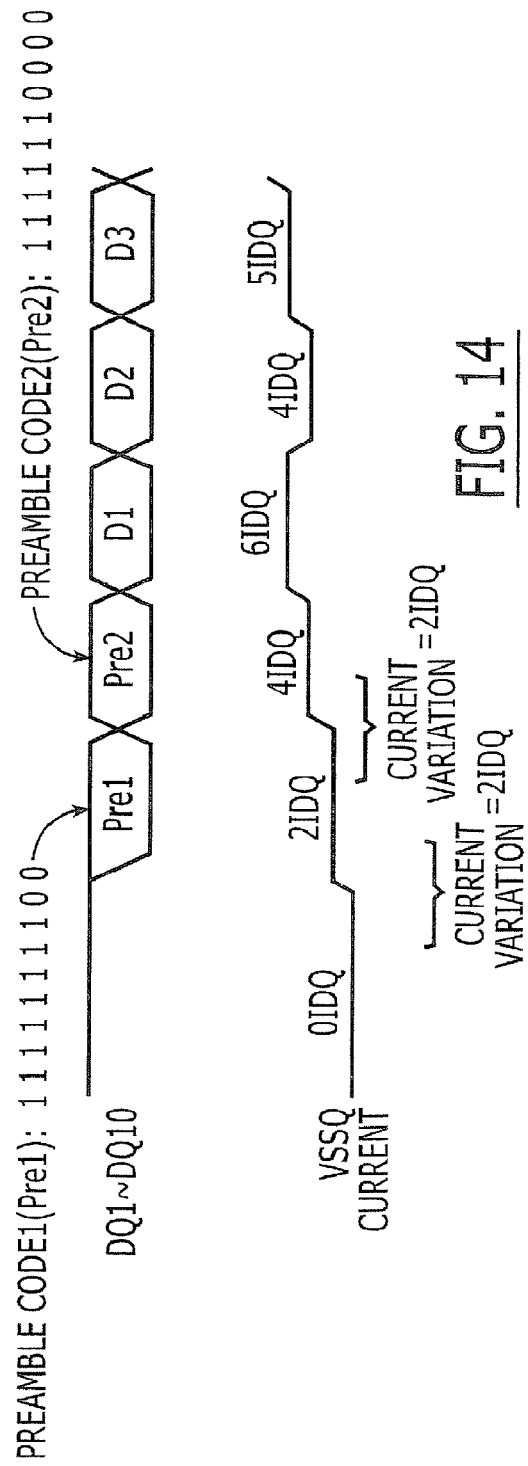

TRANSMITTING/RECEIVING METHODS AND SYSTEMS WITH SIMULTANEOUS SWITCHING NOISE REDUCING PREAMBLES

CROSS REFERENCE

This application claims the benefit of priority to and is a Continuation of U.S. patent application Ser. No. 12/367,134, filed Feb. 6, 2009 now U.S. Pat. No. 7,768,429, which is a Continuation of U.S. Ser. No. 11/693,264, filed Mar. 29, 2007, now U.S. Pat. No. 7,492,288, filed Mar. 29, 2007, which claims the benefit under 35 USC §119 of Korean Patent Application No. 10-2006-0030752, filed on Apr. 4, 2006, the disclosure of each of which is hereby incorporated herein by reference in its entirety as if set forth fully herein.

FIELD OF THE INVENTION

This invention relates to systems and methods for transmitting and receiving data, and more specifically to systems and methods for encoding and decoding data in connection with the transmitting and receiving thereof.

BACKGROUND OF THE INVENTION

Data transmitting and receiving systems and methods are increasingly used to transmit increasing amounts of data at increasingly higher speeds. In data transmitting/receiving systems and methods, it may be desirable to encode (or code) the data to facilitate transmission and to later decode the encoded data that is received. One type of coding that is widely used is DC balance coding. As is well known to those having skill in the art, DC balance coding is a technique for coding data to provide enough state changes for reasonable clock recovery while achieving DC balance and bounded disparity among adjacent data symbols.

One widely used form of DC balance coding is referred to as "8B/10B coding". As the scheme name suggests, in 8B/10B encoding, eight bits of data are transmitted as a 10-bit entity, often called a symbol or character. The least significant five bits of data are encoded into a 6-bit group, and the most significant three bits are encoded into a 4-bit group. These code groups are concatenated together to form the 10-bit symbol that is transmitted. Because 8B/10B encoding uses 10-bit symbols to encode 8-bit words, each of the 256 possible 8-bit words can be encoded in two different ways, one the bitwise inverse of the other. Using these alternative encodings, the scheme is able to effect long term DC balance. The 8B/10B encoding may be used in IEEE 1394b, Gigabit Ethernet, audio storage devices such as digital audio tape, and other widely used interfaces/devices.

8B/10B DC balance encoding is described in U.S. Pat. No. 4,486,739 to Franaszek et al., entitled "Byte Oriented DC Balanced (0,4) 8B/10B Partitioned Block Transmission Code". As stated in the Abstract of the Franaszek et al. patent, a binary DC balanced code and an encoder circuit for effecting same is described, which translates an eight bit byte of information into ten binary digits for transmission over electromagnetic or optical transmission lines subject to timing and low frequency constraints. The significance of this code is that it combines a low circuit count for implementation with excellent performance near the theoretical limits, when measured with the commonly accepted criteria. The 8B/10B coder is partitioned into a 5B/6B plus a 3B/4B coder. The input code points are assigned to the output code points so the number of bit changes required for translation is minimized and can be grouped into a few classes.

Another example of 8B/10B encoding is described in U.S. Pat. No. 5,387,911 to Gleichert et al., entitled "Method and Apparatus for Transmitting and Receiving Both 8B/10B Code and 10B/12B Code in a Switchable 8B/10B Transmitter and Receiver". As stated in the Abstract of Gleichert et al., a method and apparatus are provided for using a modified 8B/10B system for transmitting 10-bit wide data packets in 12-bit code in which 5B/6B encoder/decoders separate the 10-bit wide data into two 5-bit nibbles. Unique special codes are provided which are not capable of aliasing with other 12-bit code words to provide reliable byte boundaries.

FIG. 1 is a reproduction of FIG. 1 of U.S. Pat. No. 5,387,911 to Gleichert et al. As stated in Gleichert et al., at the top of Column 6, FIG. 1 is a block diagram of a prior art 8B wide architecture of both an 8B/10B transmitter 1 and receiver 2. A latch 4 and encoder 5 of transmitter 1 are configured to accept only 8-bit wide raw data and the encoder 5 was configured to convert the 8-bit raw data into 10-bit parallel code, which is then converted to serial data in shifter 7 and sent over transmission link 8 to the receiver 2. The receiver is also constrained to 8-bit architecture after the decoding of the 10-bit code in decoder 11.

FIG. 2A is a circuit diagram of a conventional data transmitting/receiving system, also referred to as an interface system 10, which includes a transmitter unit 20 and a receiver unit 30. Data bits DQ1 ... DQN are applied to drivers D1-DN, to drive a plurality of signal or transmission lines Line1-LineN. At the receiver unit 30, a plurality of input buffers A1-AN may include termination resistors R1-RN that may be connected to a power supply voltage VDD. A reference voltage may also be applied to the input buffers A1-AN. The reference voltage may be generated by one or more resistors that are tied between the power supply voltage VDD and a ground voltage VSS, or using other conventional techniques. Internal power supply voltages and ground voltages are designated in FIG. 2A by VDDQ and VSSQ, respectively.

As also shown in FIG. 2A, parasitic inductances L1-L4 may exist in the interface system 10. These and/or other parasitic inductances may create Simultaneous Switching Noise (SSN) by creating a current path, as shown by the dotted line labeled IDQ '0' in FIG. 2A, when transmitting a logic level ZERO. Thus, as shown in FIG. 2A, the drivers D1-DN are inverters. When the data is ONE, there may be no parasitic current path created. However, when the data is ZERO, a current path IDQ '0' is created through the transmission lines Line1-LineN. According to the data level, the total current consumption of the drivers may thereby vary, which can create SSN. The parasitic inductances L1-L4 cause the noise (jitter) and may reduce the voltage margin and/or time margin of the data signal. The noise may also degrade the data frequency and/or system performance. SSN may also be created in an interface 10' of FIG. 2B when the terminating resistors R1-RN of the receiver unit 30' are tied to ground (VSS), when the data is ONE, as shown by the dotted line IDQ '1'. Since the SSN may be caused by parasitic inductors, the SSN may also be referred to as L(di/dt) Noise.

DC balance coding can reduce the above-described SSN. In particular, as shown in FIG. 3A, a large current variation in VSSQ may be caused during data transmission of 8-bit parallel data that is not DC balance coded. For example, as shown in FIG. 3A, data words D1-D4 of data bits DQ1-DQ8 are serially transmitted in what may also be referred to as a read/write operation. As between any two adjacent words, the difference in data bits may be up to eight (a transition from all ZEROs to all ONEs, or vice versa), as shown by the current variations of 8IDQ in FIG. 3A. These current variations can create large SSN or L(di/dt) Noise as shown in FIG. 3A. It will be understood by those having skill in the art that, in FIG. 3A, the terminology XIDQ, where X=0 . . . 8, indicates the numbers of ZEROs or ONEs in the 8-bit word. Thus, 3IDQ indicates three ZEROs and five ONEs (or vice versa), and 8IQ indicates eight ZEROs and no ONEs (or vice versa).

FIG. 3B illustrates DC balance coding using 8B/10B coding schemes, wherein the minimum number of ONEs in a given word is 4, and the maximum number of ONEs in a given word is 6. Thus, as shown in FIG. 3B, an 8B/10B DC balance coded word includes 10 bits, where the number of ONEs is 4, 5 or 6, and the corresponding number of ZEROs is 6, 5 or 4. By reducing the current variation between adjacent words of 8B/10B DC balance coded data, L(di/dt) noise or SSN may be reduced.

Accordingly, DC balance encoding, such as 8B/10B DC balance encoding, can reduce simultaneous switching noise that is caused by parasitic inductances, to thereby allow high speed transmission. Nonetheless, as transmission speeds continue to increase, it may be desirable to further reduce simultaneous switching noise, even when using DC balance coding systems and methods, such as 8B/10B DC balance coding systems and methods.

SUMMARY OF THE INVENTION

DC balance encoded data is transmitted, according to some embodiments of the present invention, by transmitting a preamble of dummy data that is configured to provide an intermediate number of bits of a given logic value that is at least one bit of the given logic value but less than a maximum number of bits of a given logic value in the DC balance encoded data. The DC balance encoded data is then transmitted. It has been found, according to some embodiments of the present invention, that the preamble of dummy data can create an intermediate level of Simultaneous Switching Noise (SSN) that is more than ZERO SSN, but is less than a maximum SSN created by the DC balance encoded data. SSN caused by transmission of a first word of DC balance encoded data may thereby be reduced.

In some embodiments, the preamble of dummy data comprises a fixed preamble of dummy data that is configured to provide a fixed intermediate number of bits of a given logic value that is independent of a number of bits of the given logic value in a first word of the DC balance encoded data. For example, in some embodiments, the fixed preamble of dummy data corresponds to half the maximum number of bits of the given logic value in the DC balance encoded data. In other embodiments, when the DC balance encoded data is 8B/10B DC balance encoded data, the fixed intermediate number of bits of a given logic value is at least one bit but less than six bits of given logic value. In other embodiments that use 8B/10B DC balance encoded data, the fixed intermediate number of bits of a given logic value is three bits of the given logic value.

In yet other embodiments, the preamble of dummy data comprises a variable preamble of dummy data that is configured to provide a variable intermediate number of bits of the given logic value that is dependent on the number of bits of the given logic value in the first word of the DC balance encoded data. In some embodiments, the variable preamble may contain half the number of bits of the given logic value that are in the first word of the DC balance encoded data.

In some embodiments, a single preamble word of dummy data is provided. In other embodiments, a plurality of preamble words of dummy data are serially transmitted. The multiple preamble words of dummy data may comprise a first preamble word of dummy data and a second preamble word of dummy data having more bits of the given logic value than the first preamble word.

Moreover, fixed multiple preamble words and/or variable multiple preamble words may be provided in various embodiments of the invention. In the fixed multiple preamble words, both the first and second preamble words provide a fixed intermediate number of bits of the given logic value that are independent of the number of bits of the given logic value in the first word of the DC balance encoded data. In contrast, for the variable multiple word preambles, the first preamble word and the second preamble word are configured to provide a variable intermediate number of bits of the given logic value that are dependent on the number of bits of the given logic value in the first word of the DC balance encoded data. Combinations of fixed and variable preambles also may be provided. For example, in some embodiments, when the DC balance encoded data is 8B/10B DC balance encoded data, the first fixed preamble word has two bits of the given logic value therein, and the second fixed preamble word has four bits of the given logic value therein. In variable multiple word preambles, the first variable preamble word may have one-quarter the number of bits of the given logic value in the first word of the DC balance encoded data and the second preamble word may have one half the number of bits of a given logic value of the first word of the DC balance encoded data.

DC balance encoded data may also be received according to other embodiments of the present invention. In particular, the preamble of dummy data and the DC balance encoded data may be received. The dummy data is discarded and the DC balance encoded data that was received is decoded. The preamble of dummy data may be embodied according to any of the above-described embodiments of the invention.

Other embodiments of the invention provide methods of reducing Simultaneous Switching Noise (SSN) caused by DC balance encoded data, by transmitting a preamble that is configured to create an intermediate level of SSN that is more than ZERO SSN, but is less than a maximum SSN created by the DC balance encoded data, prior to transmitting the DC balance encoded data. The preamble may be a fixed preamble or a variable preamble, and may include a single preamble word or multiple preamble words.

Other embodiments of the present invention provide data transmitters for DC balance encoded data. These transmitters can include a data encoding unit, a preamble code generator, a multiplexer and an output driver. The data encoding unit is configured to encode data into DC balance encoded data. The preamble code generator is configured to generate a preamble of dummy data that is configured to provide an intermediate number of bits of a given logic value that is at least one bit of the given logic value but less than a maximum number of bits of the given logic value in the DC balance encoded data. The multiplexer is responsive to the data encoding unit and to the preamble generator, and is configured to provide the preamble of dummy data followed by the DC balance encoded data. Finally, the output driver is responsive to the multiplexer, and is configured to transmit the preamble of dummy data followed by the DC balance encoded data. As was described above in connection with some embodiments of the present invention, a fixed preamble, a variable preamble, a single word preamble and/or multiple preamble words may be generated and transmitted.

Other embodiments of the present invention provide data receivers. These data receivers include a data input buffer and a decoding unit. The data input buffer is configured to receive data including a preamble of dummy data followed by DC balance encoded data, and to detect and discard the dummy data. The decoding unit is configured to decode the DC balance encoded data that was received by the data input buffer. The data input buffer may include a preamble code detector that is configured to detect the dummy data, and a demultiplexer that is configured to selectively discard the dummy data and to selectively provide the DC balance encoded data to the decoding unit. As was the case in all of the above-described embodiments, the preamble of dummy data may comprise a fixed preamble, a variable preamble, a single word preamble and/or a multiple word preamble of dummy data. Moreover, data transmitters and data receivers according to embodiments of the present invention may be combined to provide a bidirectional transceiver that can both transmit data and can receive data including the preambles described above.

Finally, all of the above-described embodiments have referred to a number of bits of a given logic value. In some embodiments, this may correspond to a number of ZEROS, whereas, in other embodiments, this may correspond to a number of ONEs. In some embodiments, when the data receiver includes a terminating resistor that is connected to a power supply voltage, the bits of the given logic value are ZEROs. In contrast, in other embodiments, when the data receiver includes a terminating resistor that is connected to ground, the number of bits of the given logic value are ONEs.

BRIEF DESCRIPTION OF THE DRAWINGS

FIG. 13 is a timing diagram that provides a specific example of FIG. 11.

FIG. 14 is a timing diagram of transmitting two fixed preamble words according to some embodiments of the present invention.

DETAILED DESCRIPTION

Figure 1:
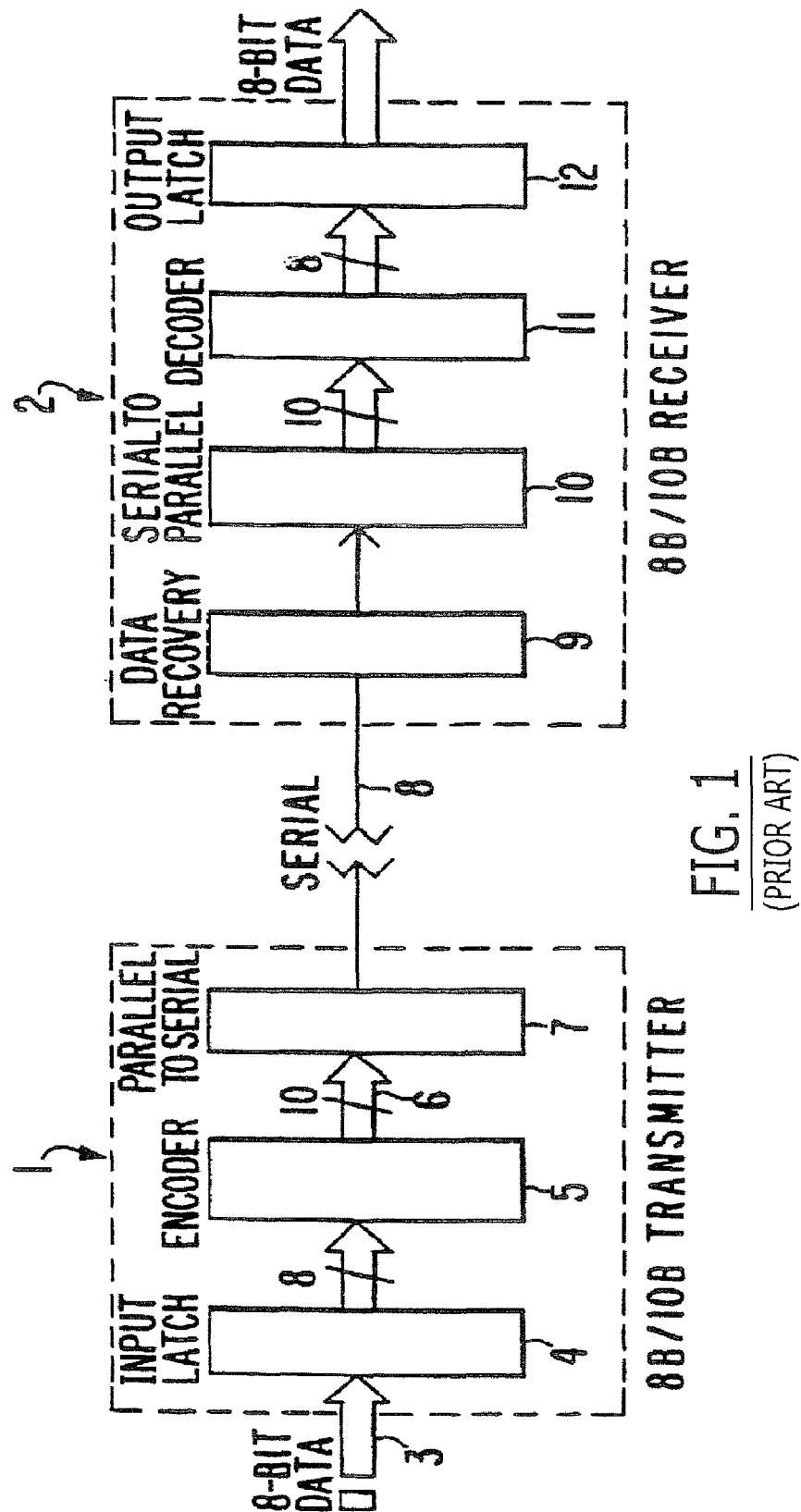
FIG. 1 is a reproduction of FIG. 1 of U.S. Pat. No. 5,387,911.
Figure 2A:
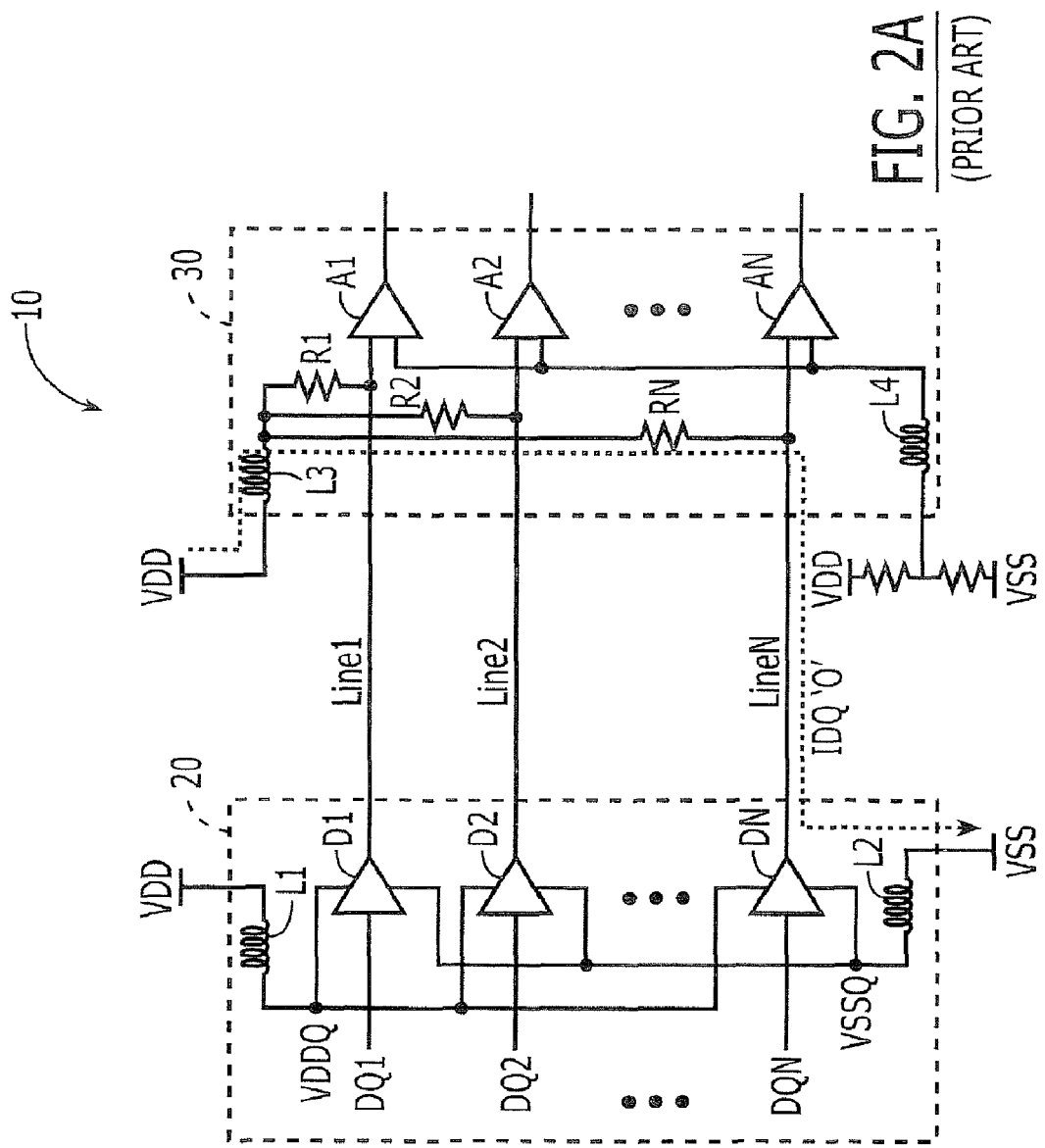
FIGS. 2A and 2B are circuit diagrams of conventional interface systems including a transmitter unit and a receiver unit.
Figure 2B:
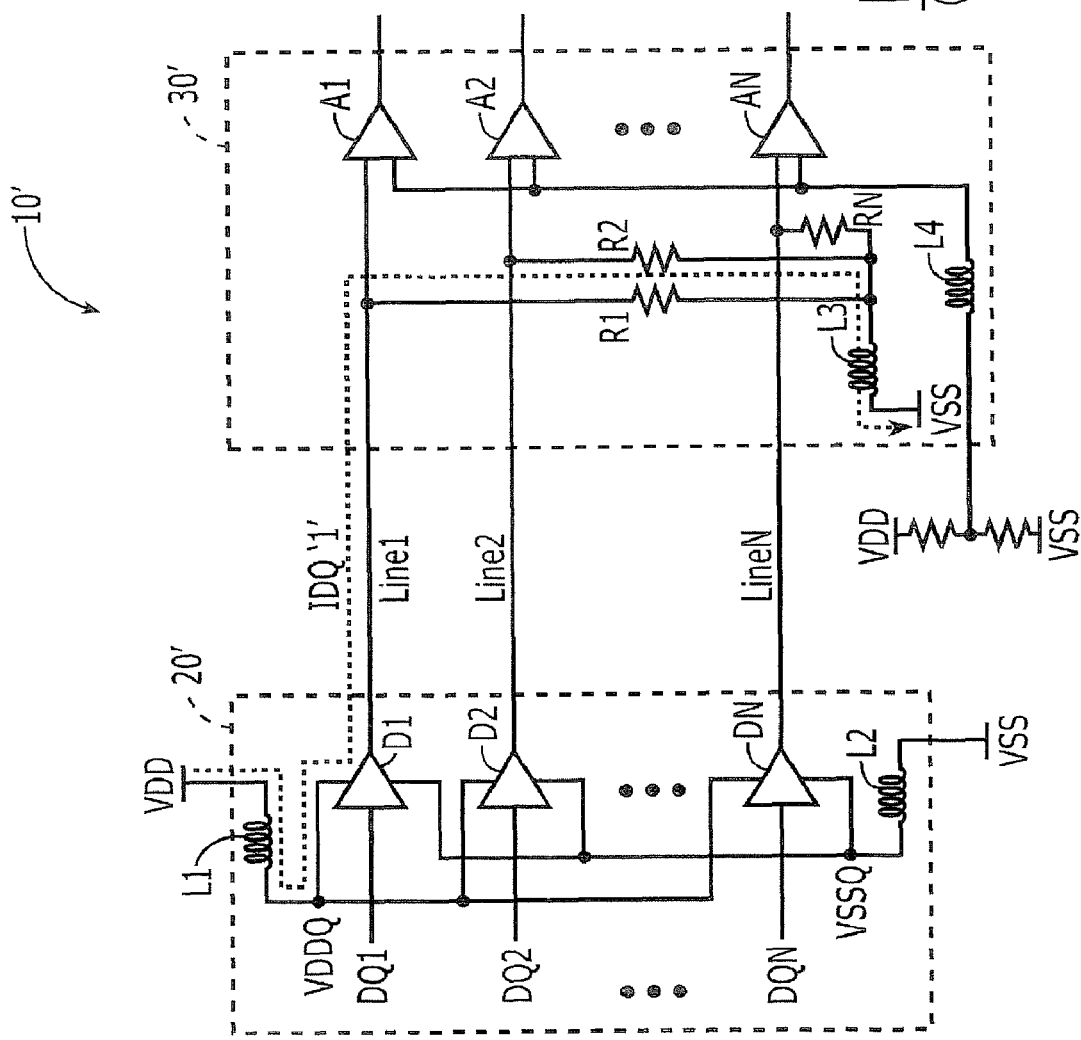
Figure 3A:
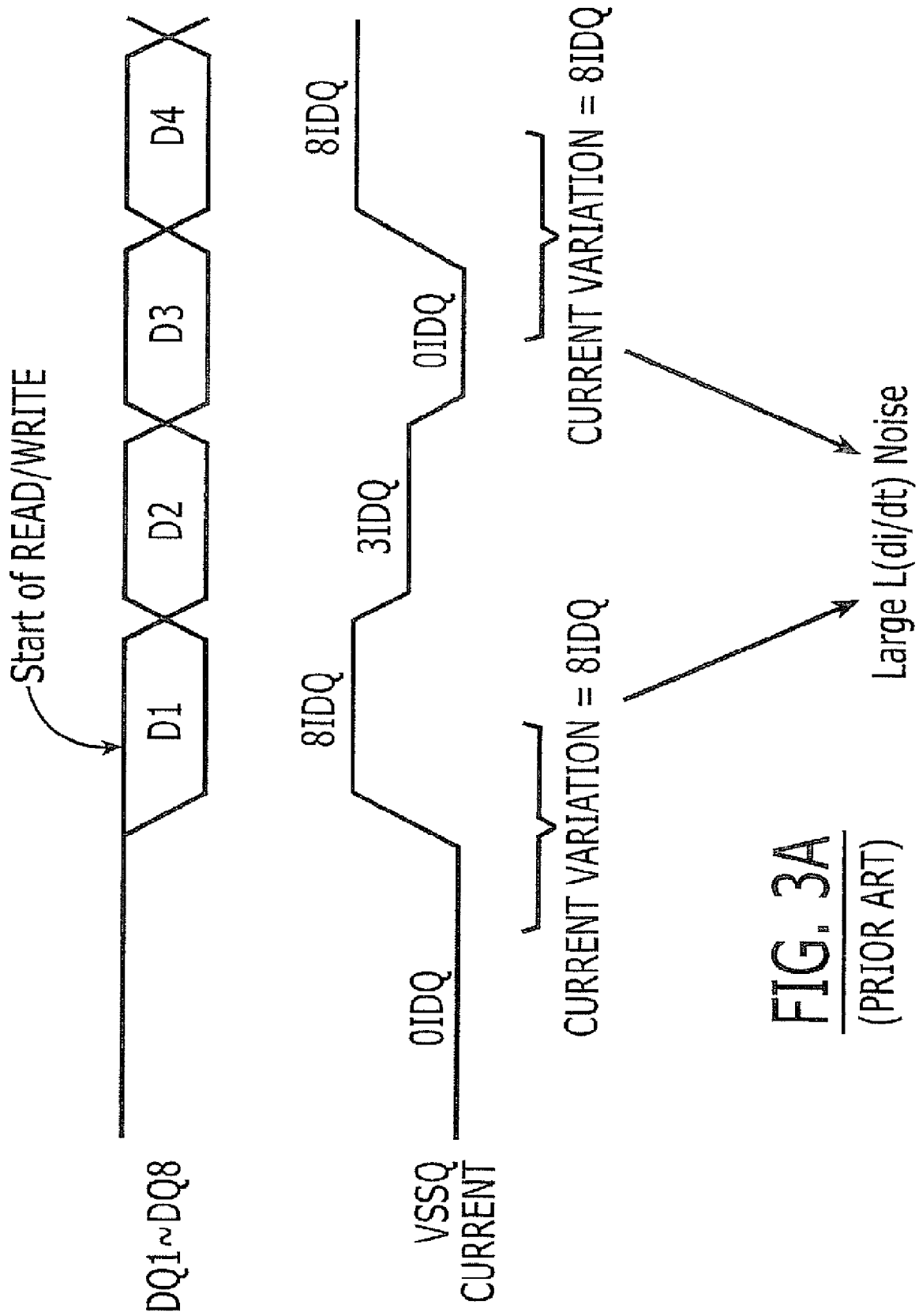
FIG. 3A is a timing diagram of current variation during conventional data transmission.
Figure 3B:
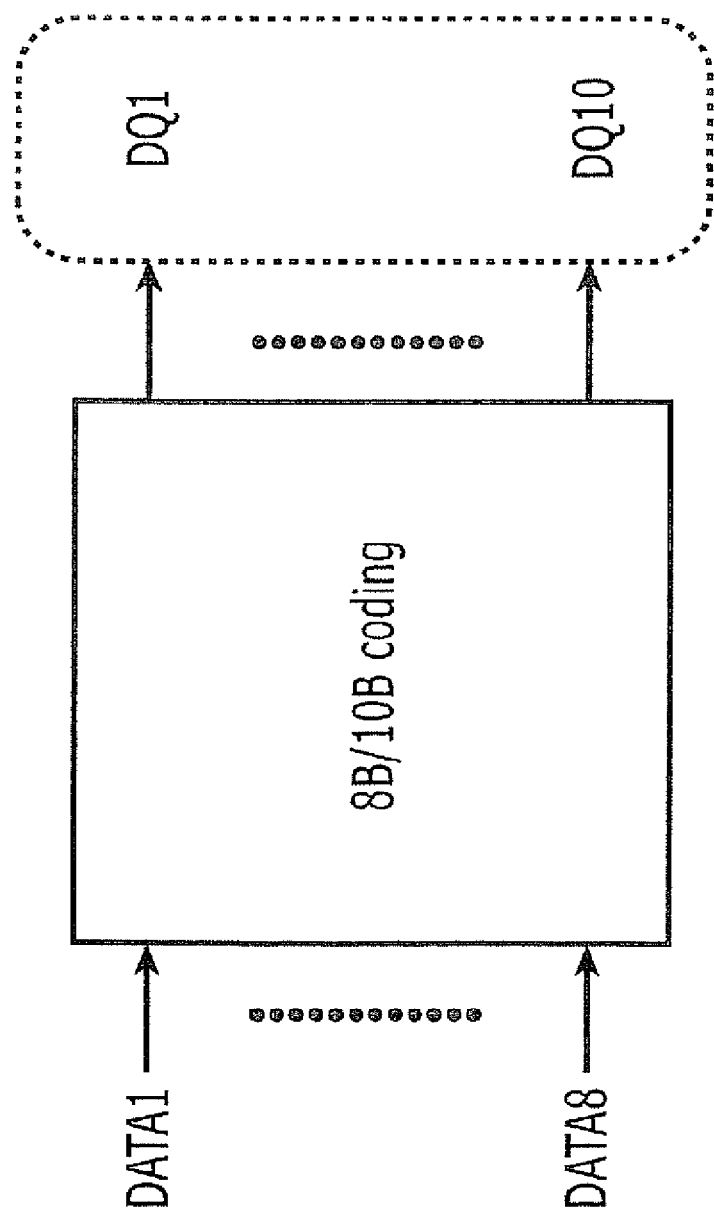
FIG. 3B is a block diagram of conventional DC balance coding using an 8B/10B coding scheme.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that when an element or layer is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 4:
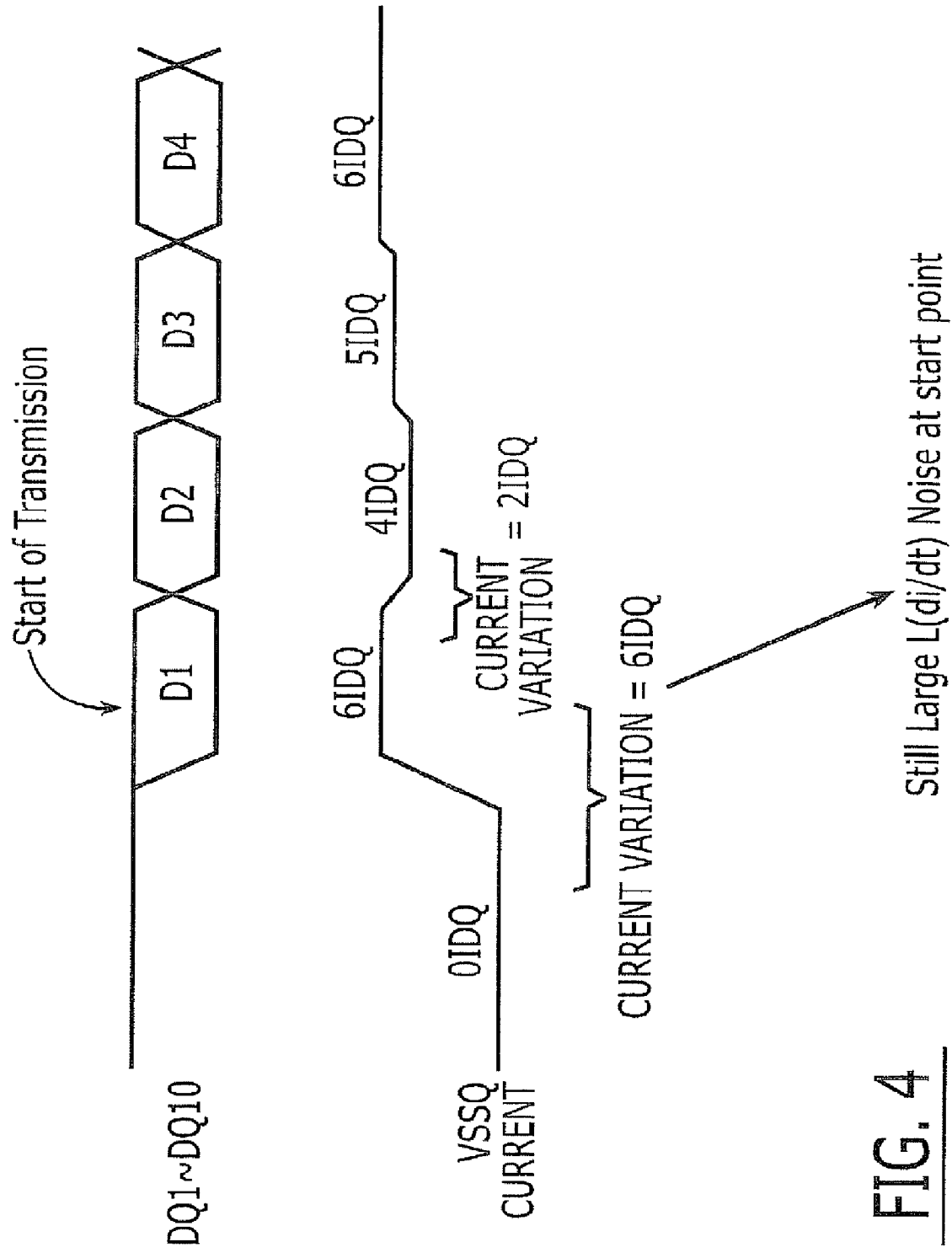
FIG. 4 is a timing diagram of DC balance coding according to some embodiments of the present invention.

Some embodiments of the present invention may arise from a recognition that, although DC balance encoded data, such as 8B/10B DC balance encoded data, can reduce Simultaneous Switching Noise (SSN) among adjacent words of data, large SSN may be created upon transmitting a first word of data. FIG. 4 illustrates this recognition. As shown in the top timing diagram of FIG. 4, a plurality of words of 8B/10B DC balance encoded data are transmitted, as indicated by words D1, D2, D3, D4. Each word includes ten bits DQ1-DQ10. The bottom trace of FIG. 4 indicates the switching current produced by each word, wherein a unit of switching current (VSSQ current) is denoted by IDQ and is proportional to the number of bits of the given logic value, here ZEROs. Thus, as shown by the bottom trace of FIG. 4, the transition between the first word D1 second word D2 produces 2IDQ current variation, the transition between the second word D2 and the third word D3 produces 1IDQ current variation and the transition between the third word D3 and the fourth word D4 produces 1IDQ current variation, in this example. As also shown, the maximum current variation among adjacent words is 2IDQ due to the 8B/10B encoding, and some adjacent words may produce a current variation of only 1IDQ or no current variation due to the 8B/10B encoding.

However, as also shown in FIG. 4, prior to transmitting the first word D1, no switching current is being produced, so that the current variation upon transmitting the first word D1 may be as high as 6IDQ, which is three times the maximum current variation that is provided among adjacent words of the DC balance encoded data. It has been recognized, according to some embodiments of the invention, that this large current variation creates large SSN, also referred to as L(di/dt) Noise, at the start point of data transmission.

Figure 5:
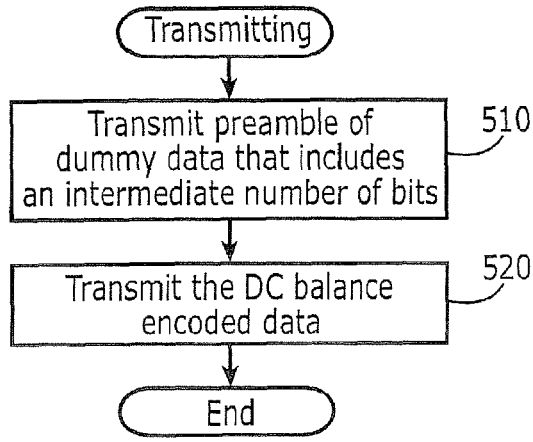
FIGS. 5 and 6 are flowcharts of operations that may be performed to transmit data according to some embodiments of the present invention.

Embodiments of the present invention can reduce this large SSN at the start of data transmission by adding a preamble of dummy data at the start of the transmission. FIG. 5 is a flowchart of operations that may be performed, according to some embodiments of the invention.

Referring now to FIG. 5, the DC balance encoded data is transmitted by first transmitting a preamble of dummy data that is configured to provide an intermediate number of bits of a given logic value. The intermediate number of bits is more than one bit of the given logic value, but less than a maximum number of bits of the given logic value in the DC balance encoded data. Then, at Block 520, the DC balance encoded data itself is transmitted. By preceding the transmission of the DC balance encoded data with a preamble of dummy data that contains an intermediate number of bits, SSN may be reduced compared to absence of the preamble data.

In one example, 8B/10B DC balance encoded data may always include four, five or six ZEROs. In these embodiments, the preamble can have between one and five ZEROS. Other examples will be described below.

As will be described in detail below, in some embodiments, the preamble of dummy data may always include the same intermediate number of bits (a fixed preamble) that is independent of the number of bits of the given logic value in the first word of DC balance encoded data. In other embodiments, the preamble may include a variable number of bits of the given logic value that depends on the number of bits of the given logic value in the first word of DC balance encoded data. Moreover, as will also be described in detail below, a single preamble word (fixed or variable) or multiple preamble words (fixed and/or variable) may be provided. The multiple preamble words may provide an even more gradual current variation and may thereby further reduce SSN compared to the use of a single preamble word. Each of these embodiments and examples thereof will be described in detail below.

Figure 6:
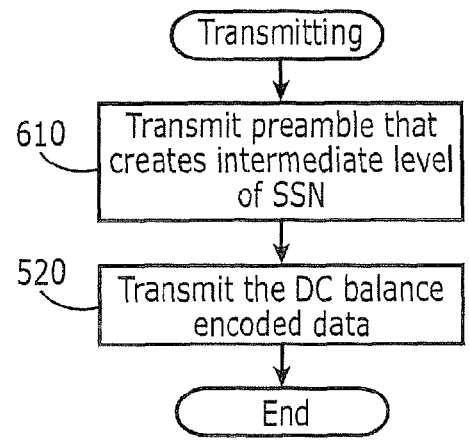

FIG. 6 is a flowchart of operations that may be performed to reduce SSN when transmitting DC balance encoded data according to other embodiments of the present invention. As shown in FIG. 6, at Block 610, a preamble is transmitted that is configured to create an intermediate level of SSN that is more than zero SSN but less than a maximum SSN created by the DC balance encoded data. Then, as was described in Block 520, the DC balance encoded data is transmitted. As was described above, the preamble may be a fixed preamble that is independent of content of a first word of the DC balance encoded data, a variable preamble that is dependent on content of the first word of the DC balance encoded data, a single preamble word and/or multiple preamble words. Accordingly, preambles that are configured in configurations other than an intermediate number of bits of the given logic value may also be provided, as long as they create an intermediate level of SSN.

Figure 7:
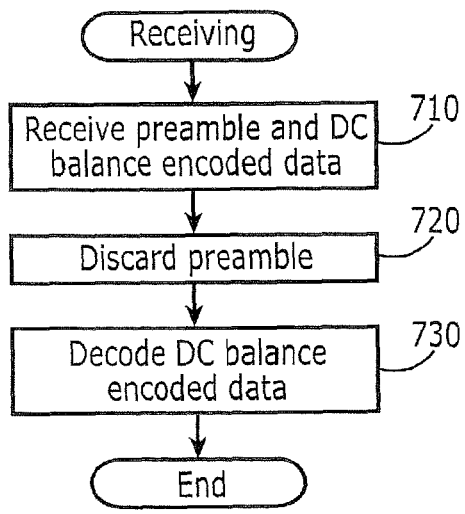
FIG. 7 is a flowchart of operations that may be performed to receive data according to some embodiments of the present invention.

FIG. 7 is a flowchart of operations that may be performed to receive DC balance encoded data according to various embodiments of the present invention. As shown in FIG. 7, a preamble according to any of the above-described embodiments, and the DC balance encoded data, are received at Block 710. The preamble is discarded at Block 720, and the DC balance encoded data is decoded at Block 730.

Various embodiments of the present invention will now be described in connection with FIGS. 8-17. In all of these embodiments, the DC balance encoded data will be 8B/10B DC balance encoded data and the bits of the given logic value will be ZEROS. These embodiments may be used with data receivers that include terminating resistors that may be connected to a power supply voltage. However, it will be understood by those having skill in the art that analogous embodiments for DC balance encoded data other than 8B/10B DC balance encoded data may be provided, and analogous embodiments may be provided if the bits of the given logic value are ONEs, for example, where the terminating resistors may be connected to ground.

Figure 8:
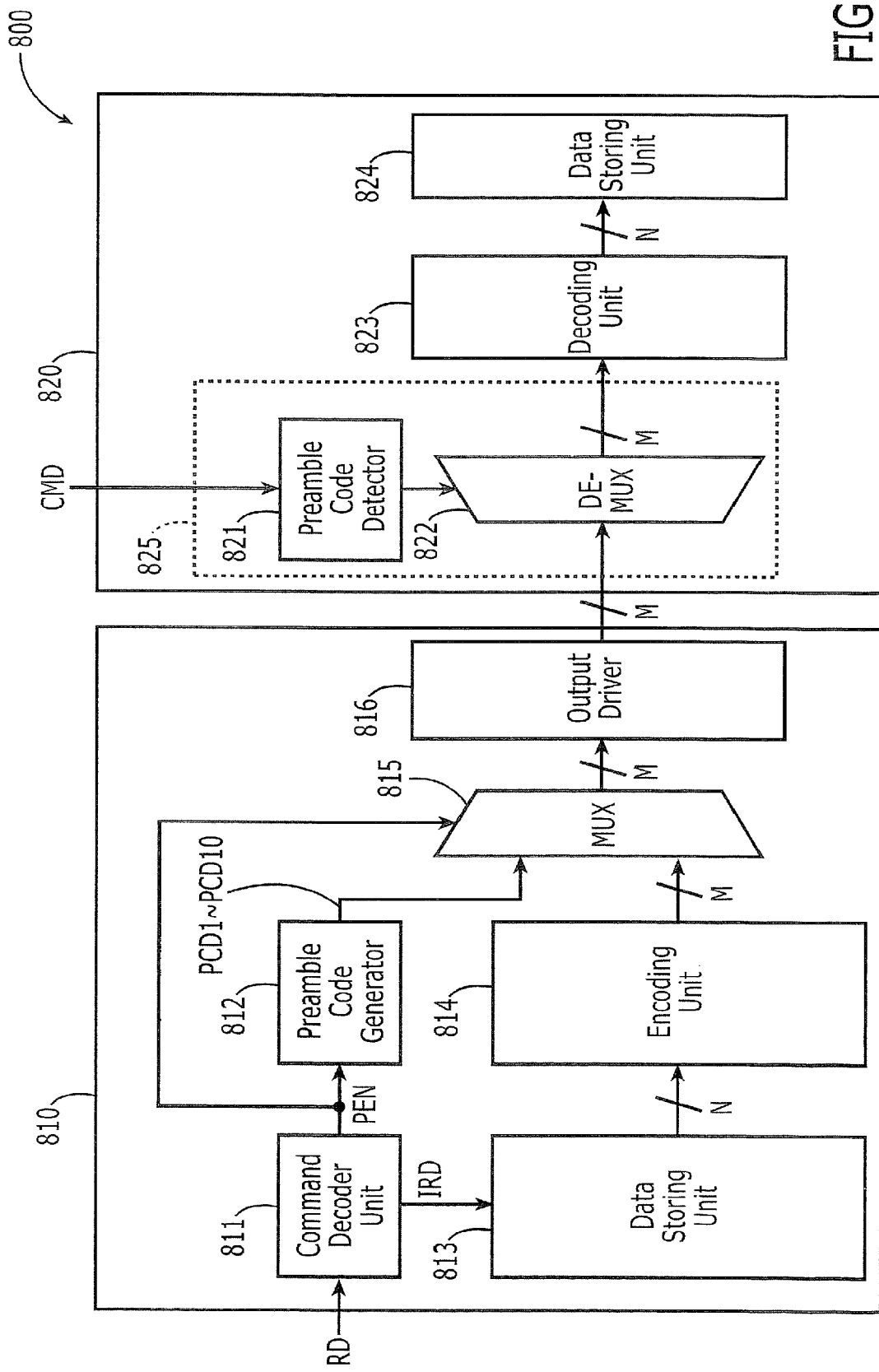
FIG. 8 is a block diagram illustrating data transmission and receiving according to various embodiments of the present invention.

FIG. 8 is a block diagram of a data transmission and receiving system 800 according to various embodiments of the present invention. The transmitting and receiving system 800 is embodied in FIG. 8 as an N-bit single-ended parallel data interface system including a transmitter 810 and a receiver 820. It will be understood, however, that although embodiments of FIG. 8 illustrate transmission from the transmitter 810 to the receiver 820, bidirectional systems also may be provided where each end includes a transmitter and a receiver.

Still referring to FIG. 8, the data transmitter 810 includes a data encoding unit 814 that is configured to encode data, such as N-bit data, into DC balance encoded data, such as M-bit data. A preamble code generator 812 is configured to generate a preamble of dummy data (PCD1-PCD10) that is configured to provide an intermediate number of bits of a given logic value (here ZEROS) that is at least one ZERO, but less than a maximum number of ZEROs in the DC balance encoded data. A multiplexer 815 is responsive to the data encoding unit 814 and to the preamble code generator 812, and is configured to provide one or more M-bit preamble words of dummy data followed by one or more M-bit words of the DC balance encoded data. An output driver 816 is responsive to the multiplexer 815 and is configured to transmit the preamble word(s) of dummy data followed by the word(s) of DC balance encoded data. As also shown in FIG. 8, the transmitter 810 may also include a data storing unit 813 that stores the original data to be DC balance encoded, and a command decoder unit 811 that decodes a command RD and controls the data storing unit 813 (IRD command), the preamble code generator 812 and the multiplexer 815 (PEN command).

Still continuing with the description of FIG. 8, the data receiver 820 includes a data input buffer 825, a decoding unit 823 and a data storing unit 824. The data input buffer 825 is configured to receive data including a preamble of dummy data followed by DC balance encoded data and to detect and discard the dummy data. The decoding unit 823 is configured to decode the DC balance encoded data that was received by the input data buffer 825.

More specifically, as shown in FIG. 8, the data input buffer 825 may include a preamble code detector 821 that is responsive to a command CMD, to detect the dummy data. A demultiplexer 822 is responsive to the preamble code detector 821 (command T) and is configured to selectively discard the dummy data, and to selectively provide DC balance encoded data (M bits) to the decoding unit 823. The decoded data (N bits) is stored in the data storing unit 824. It will also be understood by those having skill in the art that many other configurations of transmitters 810 and receivers 820 may be provided according to various other embodiments of the present invention.

M signal lines are used to transmit the digital signals between the transmitter 810 and the receiver 820. The signal lines may be "on-chip" signal lines that connect various subsystems on a single integrated circuit chip. For example, on-chip signal lines may connect a memory subsystem with a processor or host subsystem on a single integrated circuit chip. The on-chip digital signals may be, for example, data signals from a memory subsystem, often referred to as "DQ" signals. The signal lines may also be "off-chip" signal lines, wherein output drivers drive a digital signal off an integrated circuit chip over a signal line that connects a given chip with another chip, another level of packaging and/or with an external system.

Figure 9:
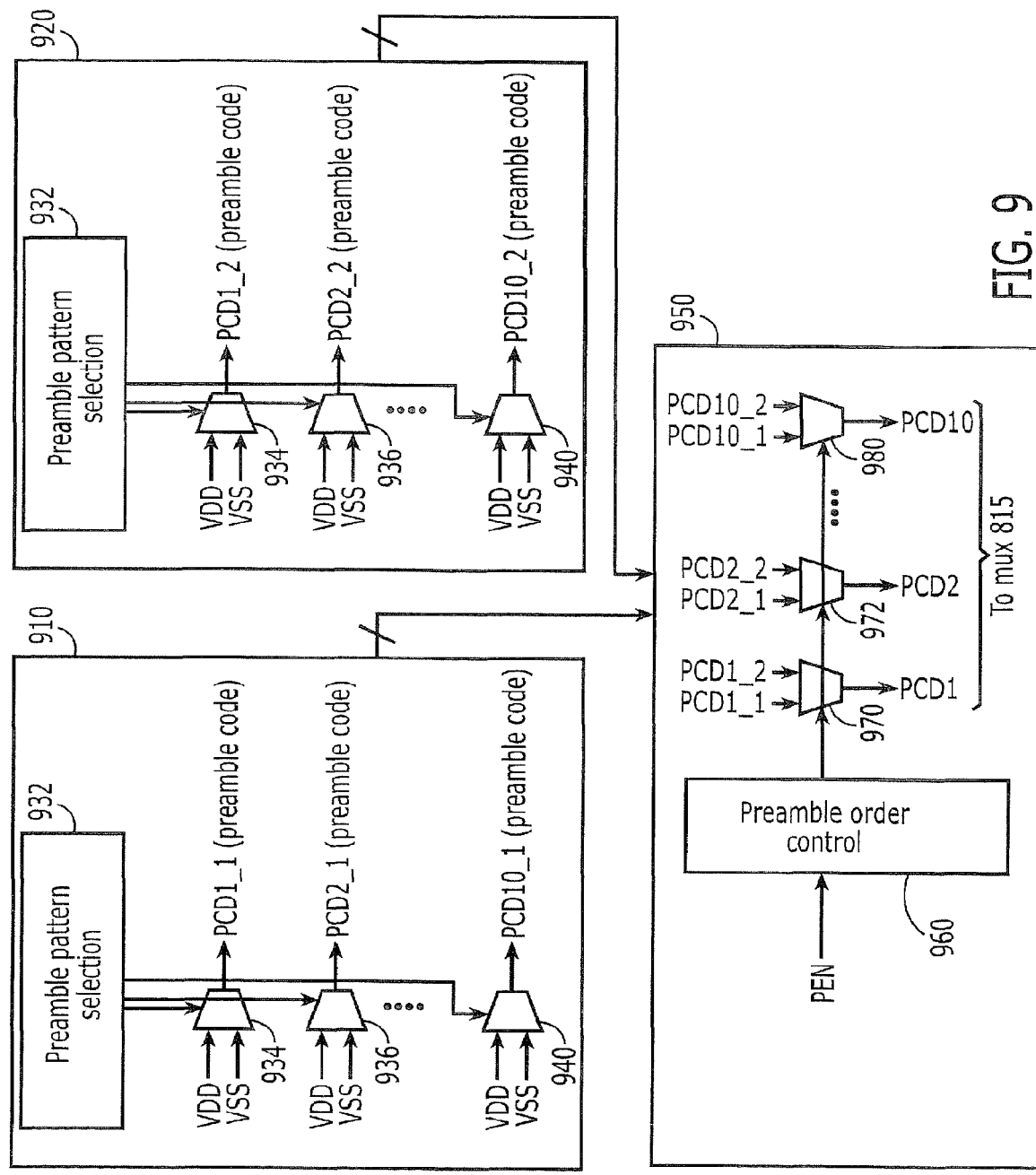
FIG. 9 is a block diagram of a preamble code generator according to some embodiments of the present invention.

FIG. 9 is a block diagram of a preamble code generator, which may correspond to the preamble code generator 812 of FIG. 8. Referring to FIG. 9, in some embodiments of the present invention, two preamble words may be generated so that embodiments of FIG. 9 include two preamble pattern generation units 910, 920. In other embodiments, where a single preamble word is always generated, only a single preamble pattern generation unit may be provided. Each preamble pattern generation unit 910, 920 includes a preamble pattern selection unit 932 and a plurality of selectors 934-940 that select a preamble code word bit PCD1_1-PCD10_1 or PCD1_2-PCD10_2 that is a ONE (VDD) or ZERO (VSS). A preamble word selector 950 then creates the appropriate preamble word or words in response to a command PEN that is applied to a preamble order control unit 960 and is selected by a plurality of selectors 970-980, the outputs of which are provided to the multiplexer 815. It will be understood by those having skill in the art that many other configurations of preamble code generators may be provided according to various other embodiments of the present invention.

Figure 10:
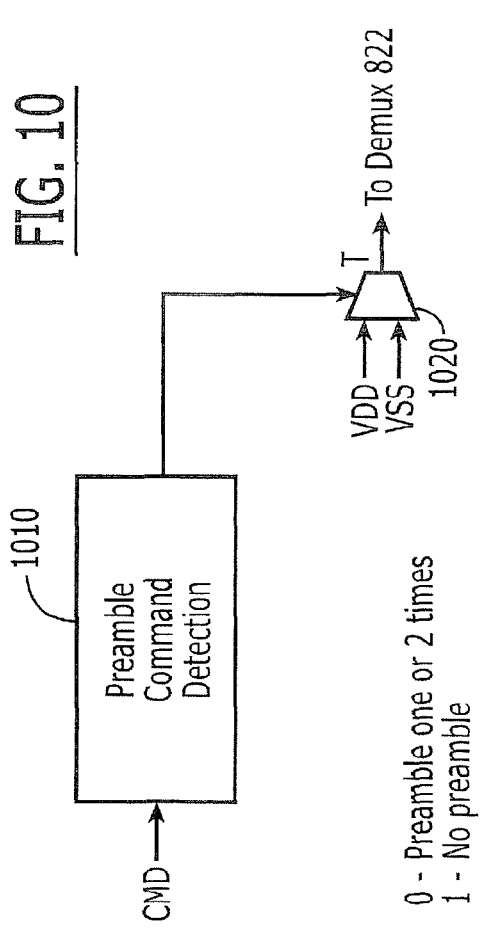
FIG. 10 is a block diagram of a preamble code detector according to some embodiments of the present invention.

FIG. 10 is a block diagram of a preamble code detector, which may correspond to preamble code detector 821 of FIG. 8, according to some embodiments of the present invention. As shown in FIG. 10, a preamble command detection unit 1010 is responsive to a command CMD, which indicates whether a preamble is present. Preamble command detection unit 1010 controls a selector 1020, which provides the command T for the demultiplexer 822 of FIG. 8. In particular, the demultiplexer 822 can discard the preamble or can send the received data to the decoding unit 823. It will also be understood that many other configurations of preamble code detectors may be provided according to various other embodiments of the present invention.

Figure 11:
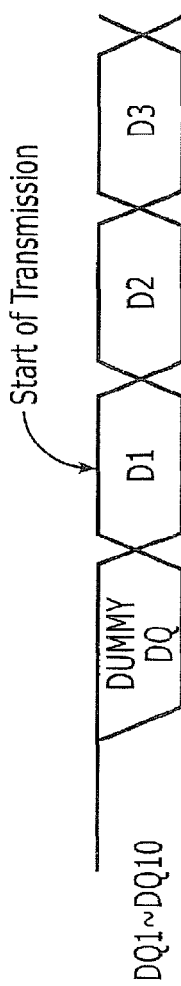
FIG. 11 is a timing diagram illustrating transmitting DC balance encoded data according to some embodiments of the present invention.

FIG. 11 is a timing diagram of systems and methods for transmitting DC balance encoded data according to some embodiments of the present invention. As shown in FIG. 11, a preamble code word of dummy data (also referred to as DUMMY DQ) is transmitted prior to transmitting the DC balance encoded data words D1-D3. The preamble of dummy data is configured to provide an intermediate number of bits of a given logic value (here ZERO), and contains at least one ZERO but less than the maximum number of ZEROs in the DC balance encoded data. For 8B/10B DC balance encoded data where the maximum number of ZEROs is 6, some embodiments of the present invention can provide a preamble that consists of 2-5 ZEROs. In some embodiments, half the maximum number of ZEROs, or three ZEROs, are contained in the preamble code. As will be described in more detail below, the preamble code may be fixed, i.e., independent of the number of ZEROs in the first word of data D1, so that, for example, it always contains three ZEROS. In other embodiments, the preamble may be a variable preamble that is dependent on the number of ZEROs in the first word D1 of DC balance encoded data. Thus, for example, if the first word D1 consists of only four ZEROs, then the preamble may contain between one ZERO and three ZEROs, and, in some embodiments, may contain half the number of ZEROs in the first word, or two ZEROS.

Figure 12:
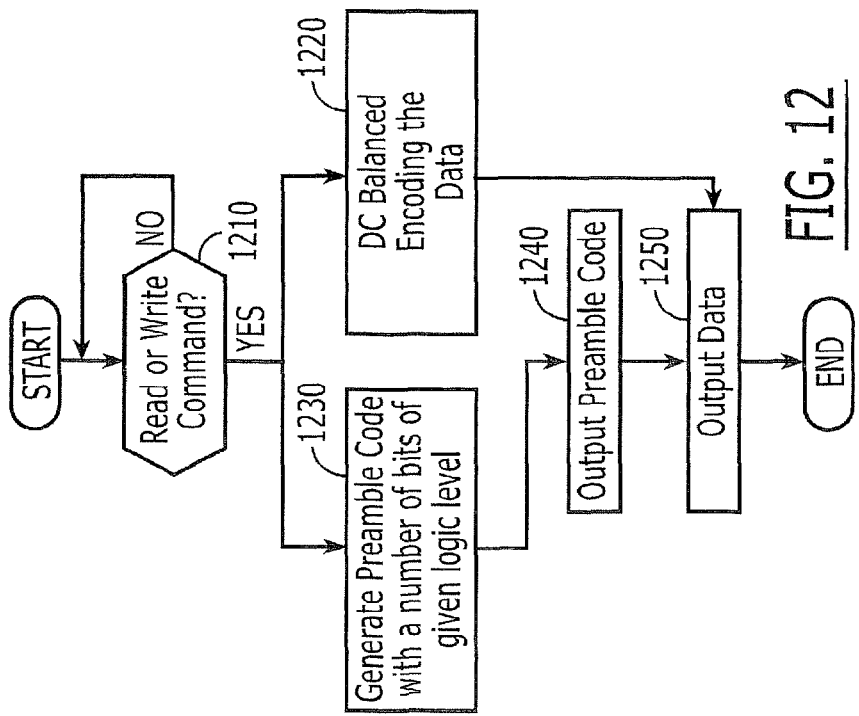
FIG. 12 is a flowchart of operations that may be performed to transmit DC balance encoded data according to some embodiments of the present invention.

FIG. 12 is a flowchart of operations that may be performed to transmit DC balance encoded data according to some embodiments of the invention, and provides more detailed operations than the flowcharts of FIGS. 5 and 6. In particular, referring to FIG. 12, operations begin when a transmit command, such as a read or write command, is received at Block 1210. Upon receiving a transmit command at Block 1210, a preamble code is generated with the intermediate number of bits of the given logic level. Moreover, the data is DC balance encoded at Block 1220. The operations of Blocks 1220 and 1230 may occur simultaneously as shown, or in any order including a partially overlapping order. The preamble code is output at Block 1240 followed by the DC balance encoded data at Block 1250.

FIG. 13 is a timing diagram illustrating a specific examples of FIG. 11. As shown in FIG. 13, a fixed single word preamble (Pre) code, which contains three ZEROs, is generated and transmitted prior to transmitting the first data word D1. A worst case scenario is shown in FIG. 13, where the first data word D1 includes six ZEROs (the maximum number in the 8B/10B encoding). As was shown in FIG. 4, without the preamble, the current variation upon transmitting the first word D1 would be 6IDQ. However, as shown in FIG. 13, with the preamble, a current variation of 3IDQ is produced upon sending the preamble, and a current variation of 3IDQ is produced between the preamble and the first word D1. Accordingly, SSN may be reduced by half by creating a maximum current variation of 3IDQ rather than 6IDQ.

FIG. 14 illustrates two fixed preamble words Pre1 and Pre2, where the first fixed preamble word Pre1 has two ZEROS, and the second preamble word Pre2 has four ZEROS. As shown, current variation in this worst case scenario has been reduced to a maximum of 2IDQ, compared to a maximum of 3IDQ in FIG. 13 and a maximum of 6ID1 in FIG. 4.

FIGS. 13 and 14 may also be used to illustrate embodiments of the present invention where variable preambles are used based upon the number of ZEROs in the first word D1. In particular, for a single preamble code (FIG. 13), the single preamble code may contain half the number of ZEROs in the first word. For example, when the first word D1 contains six ZEROs, the variable preamble may contain three ZEROS, as shown in FIG. 13. However, when the first word contains only four ZEROS, the variable preamble word may contain only two ZEROS. In some embodiments, when the first word contains five ZEROs, the variable preamble may contain two or three ZEROS.

Similarly, FIG. 14 may also be used to illustrate variable multiple preamble words according to some embodiments of the present invention. In some embodiments, when first word D1 contains six ZEROS, the preambles may contain two and four ZEROs, as shown in FIG. 14. When the first word contains only four ZEROS, then the first and second preamble words may contain only one and two ZEROs, respectively. When the first data word contains five ZEROS, the preamble may correspond to the preambles for six ZEROs or for four ZEROs, or may be a different preamble. Accordingly, fixed or variable single word and/or multiple word preambles may be provided according to various embodiments of the present invention.

Moreover, one or two preamble words may be used selectively based upon the number of ZEROs in the first data word, in still other embodiments of the invention. For example, if the first data word contains six ZEROS, two preamble words may be used, whereas if the first data word contains only four ZEROS, only a single preamble word may be used. In still other embodiments, if the number of ZEROs in the first data word is four, a preamble may not be used at all.

Figure 15:
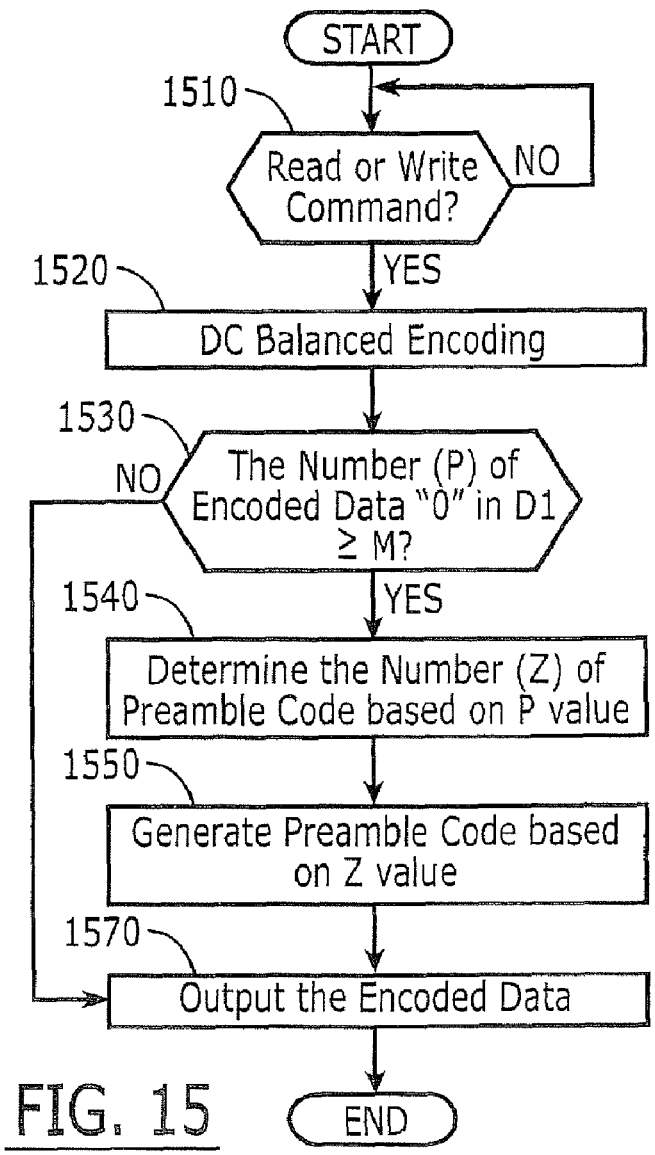
FIG. 15 is a flowchart of operations for transmitting data according to some embodiments of the present invention.

FIG. 15 is a flowchart of operations for transmitting data according to various embodiments of the present invention, wherein the number of preamble words may vary depending on the content of the first data word. In particular, as shown in FIG. 15, operations begin when a transmit command, such as a read or write command is received at Block 1510, and DC balance encoding is performed at Block 1520. A test is then performed at Block 1530, to determine whether the number (P) of encoded data ZEROs in the first data word D1 is greater than or equal to a number M. In some embodiments, M is equal to 5. If the number is not equal to or more than M, then a preamble may not be needed and the DC balance encoded data is output, at Block 1570. On the other hand, if the number is greater than or equal to M at Block 1530, then at Block 1540, the number (Z) of preamble words is determined based on the value of P. Thus, if the difference is small, a single preamble word may be used, whereas if the difference is large, multiple preamble words may be used. At Block 1550, a preamble code is generated based on the value of Z. The preamble code is output at Block 1570.

Figure 16:
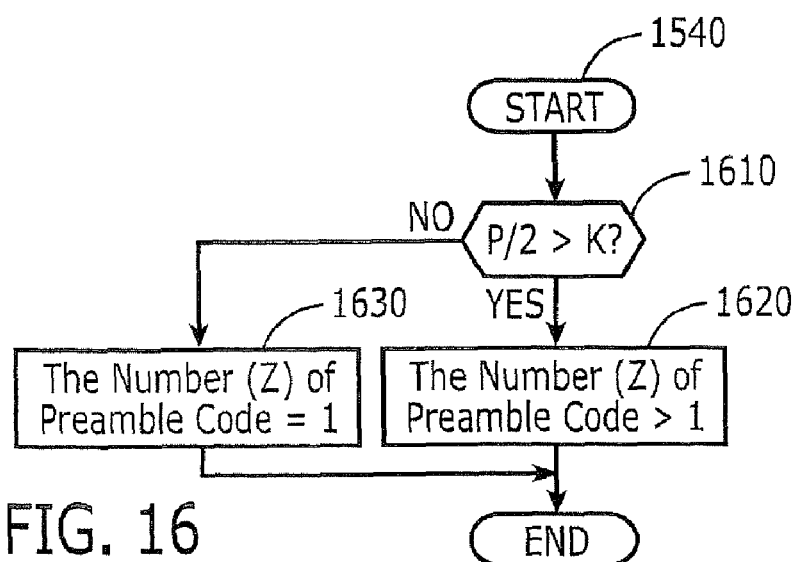
FIG. 16 is a flowchart of operations that may be performed to determine a number of preamble code words to be used according to some embodiments of the present invention.

FIG. 16 is a flowchart of detailed operations that may be performed to determine the number (Z) of preamble code words based on the value of P (the number of ZEROs in the first data word D1), which may correspond to Block 1540 of FIG. 15, according to some embodiments of the invention. In particular, as shown at Block 1610, a test is performed to determine whether the number of P divided by 2 in the encoded data is greater than a constant K. For example, assume K is equal to 2. If yes, then at Block 1620, the number (Z) of preamble code words is greater than one. For example, the number of preamble code words is equal to two. If not at Block 1610, then at Block 1630, the number of preamble code words is equal to one. In a specific example, the number of ZEROs in the first data word can be 4, 5 or 6. Assume K is equal to 2, then for five or six ZEROS, two preamble code words will be assigned at Block 1620, whereas for four ZEROS, only one preamble code word will be assigned at Block 1630.

Figure 17:
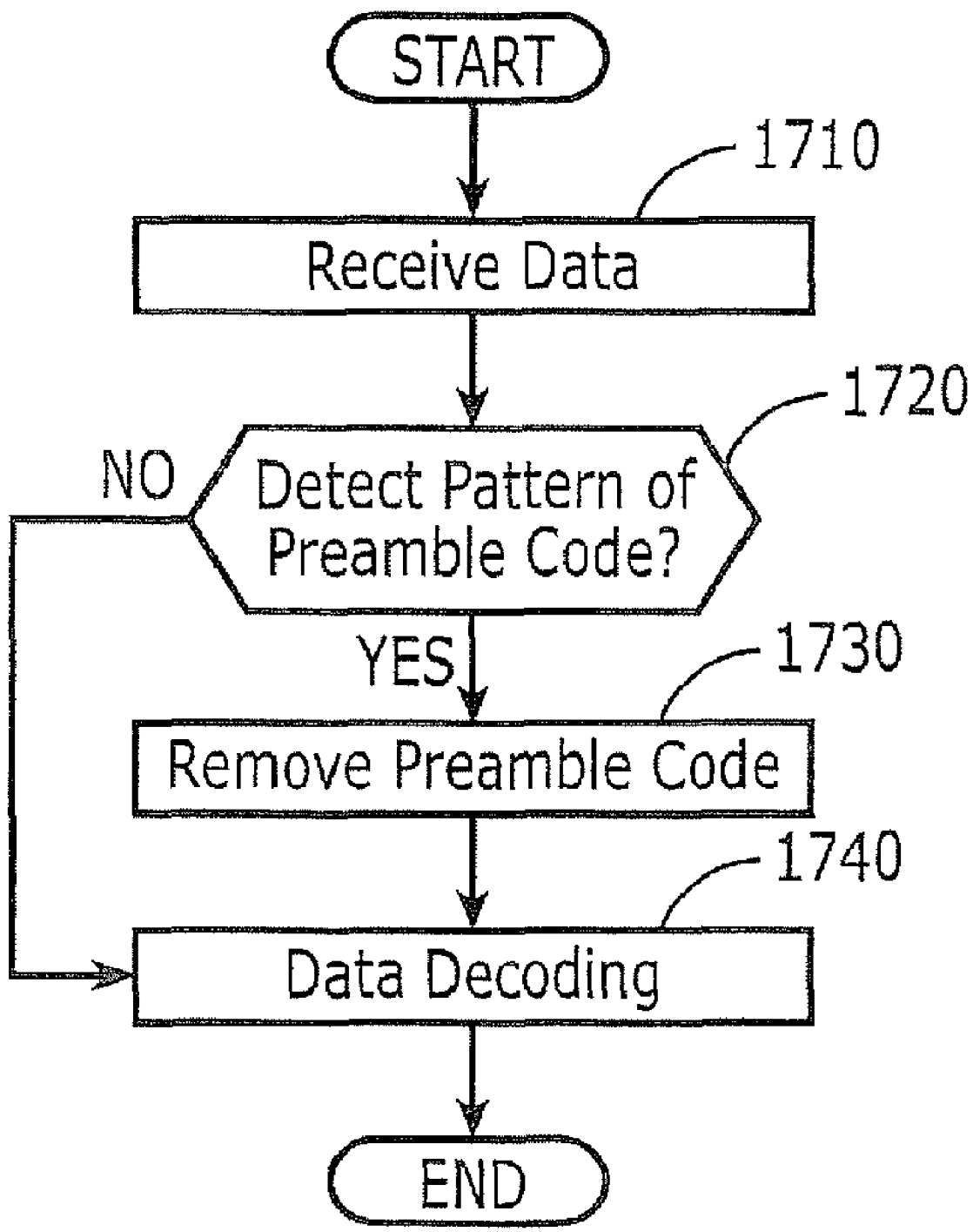
FIG. 17 is a flowchart of operations that may be performed to receive data according to some embodiments of the present invention.

Finally, FIG. 17 is a flowchart of operations that may be performed to receive data according to various embodiments of the present invention, and may provide more detailed operations than the flowchart of FIG. 7. More particularly, referring to FIG. 17, at Block 1710, the data is received including the preamble and the DC balance encoded data. At Block 1720, a pattern of the preamble code is detected. If a preamble code is not present, data decoding proceeds to Block 1740. Alternatively, if the preamble code is present at Block 1720, it is removed or discarded at Block 1730 and then data decoding proceeds at Block 1740.

Accordingly, simultaneous switching noise that is caused at the beginning of transmission of DC balance encoded data may be reduced by adding a preamble of dummy data that creates an intermediate level of SSN that is less than a maximum SSN created by the DC balance encoded data. The preamble may be selectively used depending on the value of the first data word. Moreover, the preamble may be a fixed preamble word and/or a variable preamble word, and/or may include one or more words of fixed and/or variable dummy data.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor memory device, comprising:
an input buffer configured to receive, in parallel, encoded data information from a plurality of external data information transmission lines of an external bus, the input buffer including a preamble detection circuit operable to detect a preamble having at least a first part and second part provided sequentially on the plurality of external data information transmission lines, the first part comprising first logic levels received from a first subset of n of the external data information transmission lines and second logic levels received from a second subset of (x-n) of the external data information transmission lines, where x is the number of data information transmission lines of the data bus and n is an integer less than x, and the second part comprising first logic levels received from a third subset of m of the external data information transmission lines and second logic levels received from a fourth subset of (x-m) of the external data information transmission lines, where m is an integer less than x, and wherein the first logic level is different from the second logic level and m is different from n.

2. The semiconductor memory device of claim 1, wherein n is fixed for the multiple encoded data information transmissions.

3. The semiconductor memory device of claim 2, wherein the second part is received immediately after the first part.

4. The semiconductor memory device of claim 2, wherein the first part is received immediately after the second part.

5. The semiconductor memory device of claim 2, wherein m is variable for the multiple encoded data information transmissions.

6. The semiconductor memory device of claim 2, wherein the first subset is the same and the second subset is the same for the multiple encoded data information transmissions.

7. The semiconductor memory device of claim 2, wherein the encoded data information consists of encoded data.

8. A semiconductor memory device comprising:
a preamble code circuit configured to output a preamble including a first preamble code comprising n bits and a second preamble code comprising n bits, wherein n is an integer and wherein the number of bits of the first preamble code having a first logic level is different from the number of bits of the second preamble code having the first logic level; and
an output circuit configured to output the preamble in parallel and encoded data information appended thereto in parallel on n external data information transmission lines.

9. The semiconductor memory device of claim 8,
wherein the preamble code circuit includes circuitry to generate the first preamble code so that the number of bits of the first preamble code having the first logic level is different for different encoded data information output by the output circuit, and
wherein the output circuit is configured to output the first preamble code immediately prior to the output of the second preamble code.

10. The semiconductor memory device of claim 8,
wherein the preamble code circuit includes circuitry to generate the second preamble code so that the number of bits of the second preamble code having the first logic level is different for different encoded data information output by the output circuit, and
wherein the output circuit is configured to output the first preamble code immediately prior to the output of the second preamble code.

11. The semiconductor memory device of claim 8,
wherein the preamble code circuit includes circuitry to generate the first preamble code so that the number of bits of the first preamble code having the first logic level is fixed for all encoded data information output by the output circuit, and
wherein the output circuit is configured to output the first preamble code immediately prior to the output of the second preamble code.

12. The semiconductor memory device of claim 8, wherein the encoded data information consists of encoded data.

13. A method of receiving data, comprising:
receiving at least two sets of encoded data information from a bus, each receipt of a encoded data information set comprising
receiving a preamble from the bus; and
receiving encoded data information from the bus immediately after receiving the preamble;
wherein receiving the preamble comprises receiving a first n-bit preamble code in parallel and then a second n-bit preamble code in parallel, wherein n is an integer, and
wherein the number of bits of the first preamble code having a first logic level is different from the number of bits of the second preamble code having the first logic level.

14. The method of claim 13, wherein the number of bits of the first preamble code having the first logic level is different for at least two of the at least two sets of encoded data information.

15. The method of claim 13, wherein the number of bits of the second preamble code having the first logic level is different for at least two of the at least two data sets of encoded data information.

16. The method of claim 13, wherein the number of bits of the first preamble code having the first logic level is fixed.

17. A method of transmitting data, comprising:
transmitting at least two sets of encoded data information onto a bus, each transmission of an encoded data information set comprising
transmitting a preamble onto the bus; and
transmitting encoded data information onto the bus immediately after transmitting the preamble;
wherein transmitting the preamble comprises transmitting a first n-bit preamble code in parallel and then a second n-bit preamble code in parallel, wherein n is an integer, and
wherein the number of bits of the first preamble code having a first logic level is different from the number of bits of the second preamble code having the first logic level.

18. The method of claim 17,
wherein the number of bits of the first preamble code having the first logic level is different for at least two of the at least two sets of encoded data information.

19. The method of claim 17, wherein the encoded data information consists of encoded data.

* * * * *